US010211256B2

(12) United States Patent
Kitagawa

(10) Patent No.: US 10,211,256 B2
(45) Date of Patent: Feb. 19, 2019

(54) MAGNETIC MEMORY DEVICE WITH STACK STRUCTURE INCLUDING FIRST AND SECOND MAGNETIC LAYERS AND NONMAGNETIC LAYER BETWEEN THE FIRST AND SECOND MAGNETIC LAYERS

(71) Applicant: TOSHIBA MEMORY CORPORATION, Minato-ku, Tokyo (JP)

(72) Inventor: Eiji Kitagawa, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/069,740

(22) Filed: Mar. 14, 2016

(65) Prior Publication Data

US 2017/0077176 A1    Mar. 16, 2017

Related U.S. Application Data

(60) Provisional application No. 62/216,714, filed on Sep. 10, 2015.

(51) Int. Cl.
*H01L 27/22* (2006.01)
*H01L 29/82* (2006.01)
*H01L 43/08* (2006.01)
*H01L 43/10* (2006.01)

(52) U.S. Cl.
CPC ............ *H01L 27/228* (2013.01); *H01L 43/08* (2013.01); *H01L 43/10* (2013.01)

(58) Field of Classification Search
CPC . H01L 27/228; H01L 43/10; H01L 21/76826; H01L 21/76834; H01L 21/76846; H01L 21/76883; H01L 43/02; H01L 43/08
USPC .................................................. 257/421, 427
See application file for complete search history.

(56) References Cited

U.S. PATENT DOCUMENTS

| | | | |
|---|---|---|---|
| 7,735,213 B2 | 6/2010 | Yasui et al. | |
| 8,018,759 B2 | 9/2011 | Kano et al. | |
| 8,092,698 B2 | 1/2012 | Kim et al. | |
| 2006/0126371 A1* | 6/2006 | Nagase | B82Y 10/00 365/145 |
| 2007/0258170 A1* | 11/2007 | Yuasa | H01L 43/12 360/324.2 |
| 2009/0080238 A1 | 3/2009 | Yoshikawa et al. | |
| 2010/0230770 A1 | 9/2010 | Yoshikawa et al. | |

(Continued)

FOREIGN PATENT DOCUMENTS

| | | |
|---|---|---|
| JP | 2009081216 A | 4/2009 |
| JP | 2010062191 A | 3/2010 |
| JP | 2013073978 A | 4/2013 |

*Primary Examiner* — Duy T Nguyen
(74) *Attorney, Agent, or Firm* — Holtz, Holtz & Volek PC

(57) ABSTRACT

According to one embodiment, a magnetic memory device includes a stack structure including a first magnetic layer having a variable magnetization direction, a second magnetic layer having a fixed magnetization direction, and a nonmagnetic layer provided between the first magnetic layer and the second magnetic layer, wherein the second magnetic layer includes a first layer containing iron (Fe) and boron (B), a second layer containing iron (Fe) and boron (B), and a third layer provided between the first layer and the second layer and containing a semiconductor.

20 Claims, 7 Drawing Sheets

(56) References Cited

U.S. PATENT DOCUMENTS

| | | |
|---|---|---|
| 2011/0211389 A1 | 9/2011 | Yoshikawa et al. |
| 2011/0222335 A1 | 9/2011 | Yoshikawa et al. |
| 2013/0077388 A1 | 3/2013 | Inokuchi et al. |
| 2015/0332748 A1* | 11/2015 | Wang .................... G11C 11/165 365/158 |

\* cited by examiner

MAGNETIC MEMORY DEVICE WITH STACK STRUCTURE INCLUDING FIRST AND SECOND MAGNETIC LAYERS AND NONMAGNETIC LAYER BETWEEN THE FIRST AND SECOND MAGNETIC LAYERS

CROSS-REFERENCE TO RELATED APPLICATIONS

This application claims the benefit of U.S. Provisional Application No. 62/216,714, filed Sep. 10, 2015, the entire contents of which are incorporated herein by reference.

FIELD

Embodiments described herein relate generally to a magnetic memory device.

BACKGROUND

There are proposed magnetic memory devices (semiconductor integrated circuit devices) in which a transistor and a magnetoresistive effect element are integrated on a semiconductor substrate.

When the magnetoresistive effect element is miniaturized, a shift field adversely increases. To reduce the shift field, Mst (which corresponds to magnetization per unit area) should be decreased. However, generally, when Mst is decreased, the MR ratio is decreased, too.

Therefore, magnetic memory devices comprising a magnetoresistive effect element with both low Mst and high MR ratio are demanded.

DETAILED DESCRIPTION

In general, according to one embodiment, a magnetic memory device includes a stack structure including a first magnetic layer having a variable magnetization direction, a second magnetic layer having a fixed magnetization direction, and a nonmagnetic layer provided between the first magnetic layer and the second magnetic layer, wherein the second magnetic layer includes a first layer containing iron (Fe) and boron (B), a second layer containing iron (Fe) and boron (B), and a third layer provided between the first layer and the second layer and containing a semiconductor.

Hereinafter, embodiments will be described with reference to accompanying drawings.

Figure 1:
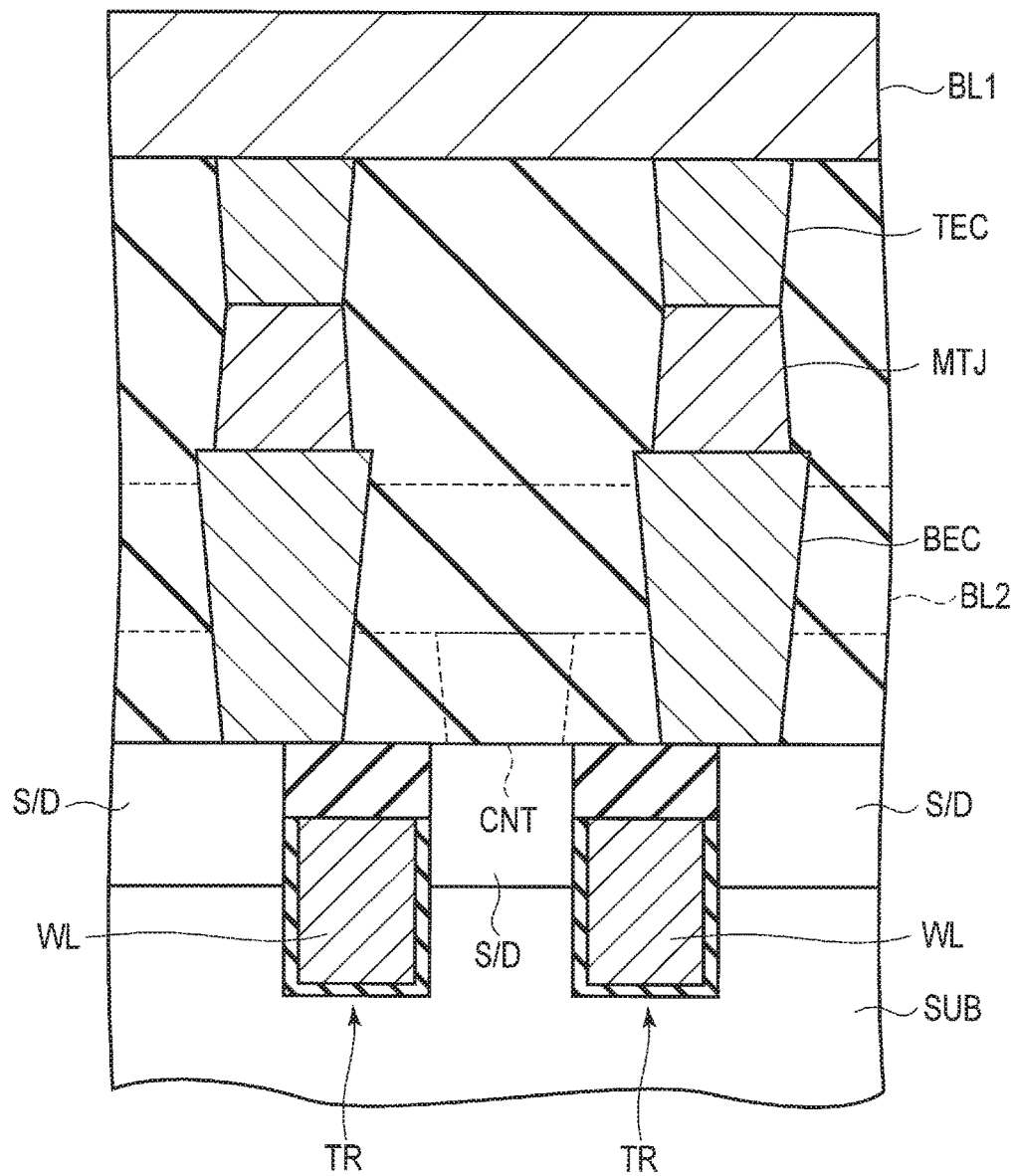
FIG. 1 is a cross-sectional view which schematically shows the structure of a magnetic memory device in which a magnetoresistive effect element of an embodiment is used.

FIG. 1 is a cross-sectional view which schematically shows a magnetic memory device (semiconductor integrated circuit device) in which a magnetoresistive effect element (magnetic tunnel junction [MTJ] element) of an embodiment is used.

As shown in FIG. 1, a buried-gate MOS transistor TR is formed in a semiconductor substrate SUB. The gate electrode of the MOS transistor TR is used as a word line WL. A bottom electrode BEC is connected to one of source/drain regions S/D and a contact CNT is connected to the other one of the source/drain regions S/D in the MOS transistor TR.

A magnetoresistive element MTJ is formed on the bottom electrode BEC, and a top electrode TEC is formed on the magnetoresistive effect element MTJ. A first bit line BL1 is connected to the top electrode TEC. A second bit line BL2 is connected to the contact CNT.

Figure 2:
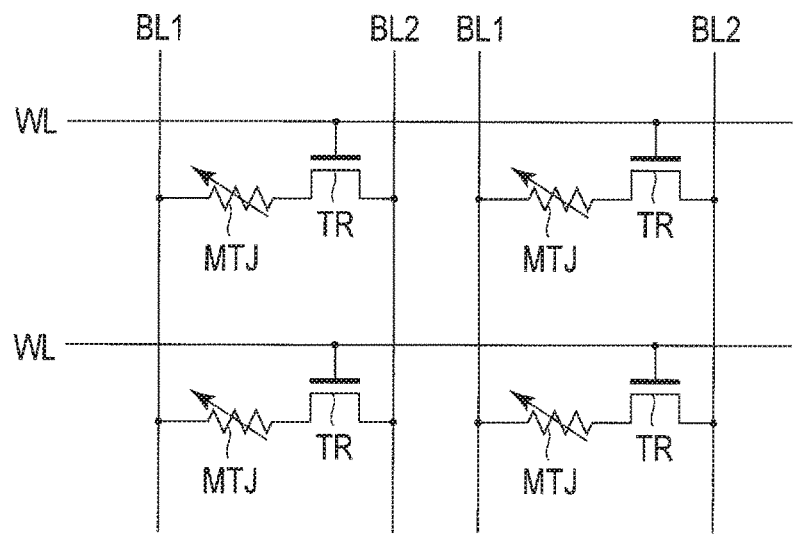
FIG. 2 shows an equivalent circuit of the structure of the magnetic memory device in which the magnetoresistive effect element of the embodiment is used.

FIG. 2 shows an equivalent circuit of the structure of the magnetic memory device (semiconductor integrated circuit device) in which the magnetoresistive effect element of the embodiment is used.

As shown in FIG. 2, series circuit units of the magnetoresistive effect elements MTJ and the MOS transistors TR are arranged in an array. One end of each series circuit unit is connected to the first bit line BL1 and the other end is connected to the second bit line BL2. The gate electrode of each magnetoresistive effect element MTJ is connected to the word line WL.

Figure 3:
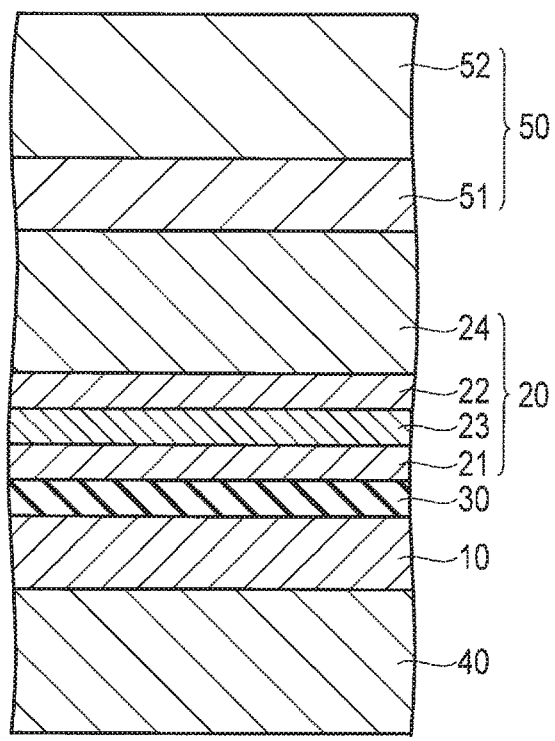
FIG. 3 is a cross-sectional view which schematically shows a stack structure of the magnetoresistive effect element of the embodiment.

FIG. 3 is a cross-sectional view which schematically shows a stack structure of the magnetoresistive effect element of the embodiment.

The stack structure shown in FIG. 3 includes a storage layer (first magnetic layer) 10 which has a variable magnetization direction, a reference layer (second magnetic layer) 20 which has a fixed magnetization direction, and a tunnel barrier layer (nonmagnetic layer) 30 disposed between the storage layer 10 and the reference layer 20. Here, the fixed magnetization direction is a magnetization direction which does not change with respect to a predetermined write current. In the example of FIG. 3, the stack structure includes an under layer 40 and upper layer 50 in addition to the above layers.

The storage layer (first magnetic layer) 10 contains iron (Fe) and boron (B). In the present embodiment, the storage layer 10 contains cobalt (Co) in addition to iron (Fe) and boron (B). Specifically, in the present embodiment, the storage layer 10 is formed of a CoFeB layer having a thickness of 1.4 nm.

The reference layer (second magnetic layer) 20 includes a first layer 21 containing iron (Fe) and boron (B), second layer 22 containing iron (Fe) and boron (B), and third layer 23 containing a semiconductor and disposed between the first layer 21 and the second layer 22. The first layer 21 contacts a nonmagnetic layer 30 described later. In the present embodiment, the reference layer (second magnetic layer) 20 includes a fourth layer 24 in addition to the first, second, and third layers 21, 22, and 23. The first, second, and third layers 21, 22, and 23 are disposed between the nonmagnetic layer 30 and the fourth layer 24.

In the present embodiment, the first layer 21 and the second layer 22 contain cobalt (Co) in addition to iron (Fe) and boron (B). Specifically, in the present embodiment, the first layer 21 is formed of a CoFeB layer having a thickness of 0.4 nm and the second layer 22 is formed of a CoFeB layer having a thickness of 0.3 nm. In both the first layer 21 and the second layer 22, the concentration of boron (B) in the CoFeB layer should be 30 atom % or more.

The third layer 23 contains a semiconductor and has a thickness of 0.5 nm or less. In the present embodiment, the semiconductor contained in the third layer 23 is at least one group-4 semiconductor element such as silicon (Si) and germanium (Ge). Note that the third layer 23 may contain a compound semiconductor such as ZnSe and GaAs.

The third layer 23 may contain an additional material along with the semiconductor. For example, the third layer 23 may contain components of the first layer 21 and the second layer 22 in addition to the semiconductor. That is, the third layer 23 may contain iron (Fe) and boron (B) in addition to the semiconductor, or may contain iron (Fe), boron (B), and cobalt (Co) in addition to the semiconductor. In the former case, the third layer 23 is composed of an FeB layer containing a semiconductor (Si, Ge, ZnSe, GaAs, or the like), and in the latter case, the third layer 23 is composed of a CoFeB layer containing a semiconductor (Si, Ge, ZnSe, GaAs, or the like). In the present embodiment, the third layer 23 is formed of a CoFeB layer containing Si of thickness 0.3 nm.

Alternately, the third layer 23 may be formed of a semiconductor layer, that is, the third layer 23 may substantially be formed of a semiconductor alone. For example, the third layer 23 may be a silicon (Si) layer, germanium (Ge) layer, ZnSe layer, GaAs layer, or the like.

The fourth layer 24 contains a material which is not used in the first layer 21, second layer 22, or third layer 23. Specifically, the fourth layer 24 is a stack film including a Ta layer (of thickness 0.2 nm), CoFeB layer (of thickness 0.6 nm), and TbCoFe layer (of thickness 12 nm) stacked in this order from the bottom side to the top side. Note that, generally, the fourth layer 24 includes a layer containing an element selected from a group of Tb, Dy, and Gd and an element selected from a group of Co and Fe, and the magnetization of the first layer, second layer, and third layer 21, 22, and 23 is coupled with the magnetization of the fourth layer 24 in an antiparallel manner.

The tunnel barrier layer (nonmagnetic layer) 30 is an insulating layer and containing magnesium (Mg), silicon (Si), and oxygen (O). Specifically, the tunnel barrier layer 30 contains magnesium oxide (MgO), silicon oxide (SiO), magnesium silicon oxide (MgSiO), and the like.

In the tunnel barrier layer (nonmagnetic layer) 30, the concentration of magnesium (Mg) is higher on the storage layer (first magnetic layer) 10 side than on the reference layer (second magnetic layer) 20 side. Specifically, the concentration of magnesium oxide (MgO) is higher on the storage layer 10 side than on the reference layer 20 side. Furthermore, in the tunnel barrier layer (nonmagnetic layer) 30, the concentration of silicon (Si) is higher on the reference layer (second magnetic layer) 20 side than on the storage layer (first magnetic layer) 10 side. Specifically, the concentration of silicon oxide (SiO) is higher on the reference layer 20 side than on the storage layer 10 side. In other words, in the tunnel barrier layer 30, the concentration of Mg (MgO concentration) is higher than the concentration of Si (SiO concentration) on the storage layer 10 side while the concentration of Si (SiO concentration) is higher than the concentration of Mg (MgO concentration) on the reference layer 20 side.

Furthermore, the tunnel barrier layer 30 should include a crystal structure. Specifically, 50% or more by volume of the tunnel barrier layer (containing Mg, Si, and O) 30 should be crystallized. Since the tunnel barrier layer 30 is crystallized, a $\Delta 1$ band is formed and a high MR ratio can be achieved.

Furthermore, the tunnel barrier layer (containing Mg, Si, and O) 30 should include an oxygen deficiency structure. Since the tunnel barrier layer includes the oxygen deficiency structure, the crystallization of MgSiO is promoted and a high MR ratio can be achieved.

The under layer 40 is an HfB layer (of thickness 5 nm) and the upper layer 50 is a stack film including a tantalum layer (of thickness 2 nm) 51 and a ruthenium (Ru) layer (of thickness 15 nm) 52. Note that the upper layer 50 may be formed of an HfB layer (of thickness 2 nm), a ruthenium (Ru) layer (of thickness 3 nm) on the HfB layer, and an AlB layer (of thickness 30 nm) on the ruthenium layer. With the HfB layer largely occupied by an amorphous structure, corrosion of the TbCoFe layer immediately under the HfB layer can be prevented and the ruthenium layer used as an etching stopper can be thinned. The AlB layer is used as a mask in patterning of the stack structure.

Both the storage layer 10 and the reference layer 20 are a ferromagnetic layer having perpendicular magnetization. That is, the storage layer 10 has a magnetization direction (magnetic anisotropy) which is perpendicular to its main surface, and the reference layer 20 has a magnetization direction (magnetic anisotropy) which is perpendicular to its main surface.

Here, the perpendicular magnetization direction (magnetic anisotropy) is a magnetization direction which is perpendicular or substantially perpendicular to the film surfaces (upper surface/lower surface). The phrase "substantially perpendicular" means that angle $\theta$ of residual magnetization with respect to the film surfaces is such that $45° < \theta \leq 90°$.

The resistance of the stack structure (resistance of the magnetoresistive effect element) is lower where a magnetization direction of the storage layer 10 and a magnetization direction of the first layer 21 of the reference layer 20 are parallel as compared to a case where the magnetization direction of the storage layer 10 and the magnetization direction of the first layer 21 of the reference layer 20 are antiparallel. That is, the magnetoresistive effect element (MTJ element) indicates a low-resistance state where the magnetization direction of the storage layer 10 and the magnetization direction of the first layer 21 of the reference layer 20 are parallel, and indicates a high-resistance state where they are antiparallel. Therefore, the magnetoresistive effect element can store a binary value (0 or 1) depending on its resistance state (low or high). The resistance state (low or high) can be set to correspond to a write current direction flowing in the magnetoresistive effect element.

As explained above, in the present embodiment, the third layer 23 containing a semiconductor is disposed between the first layer (containing iron [Fe] and boron [B]) 21 and the second layer (containing iron [Fe] and boron [B]) 22 in the reference layer 20. With this structure, a magnetoresistive effect element having low Mst and high MR ratio can be achieved, and thus, a magnetic memory device of excellent performance can be achieved.

Furthermore, the tunnel barrier layer 20 containing magnesium (Mg), silicon (Si), and oxygen (O) is used in the present embodiment. With this structure, a magnetoresistive effect element having low Mst and high MR ratio can be achieved more effectively, and thus, a magnetic memory device of excellent performance can be achieved.

Now, various features of the magnetoresistive effect element of the present embodiment will be explained.

Figure 4:
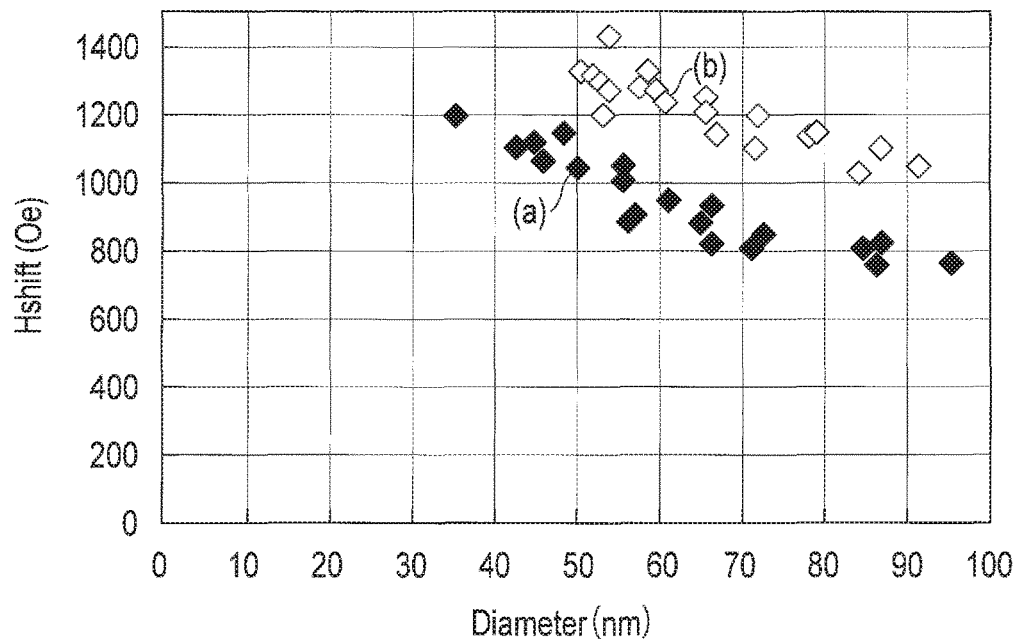
FIG. 4 shows performance evaluation results of the magnetoresistive effect element of the embodiment and a magnetoresistive effect element of a comparative example.
Figure 5:
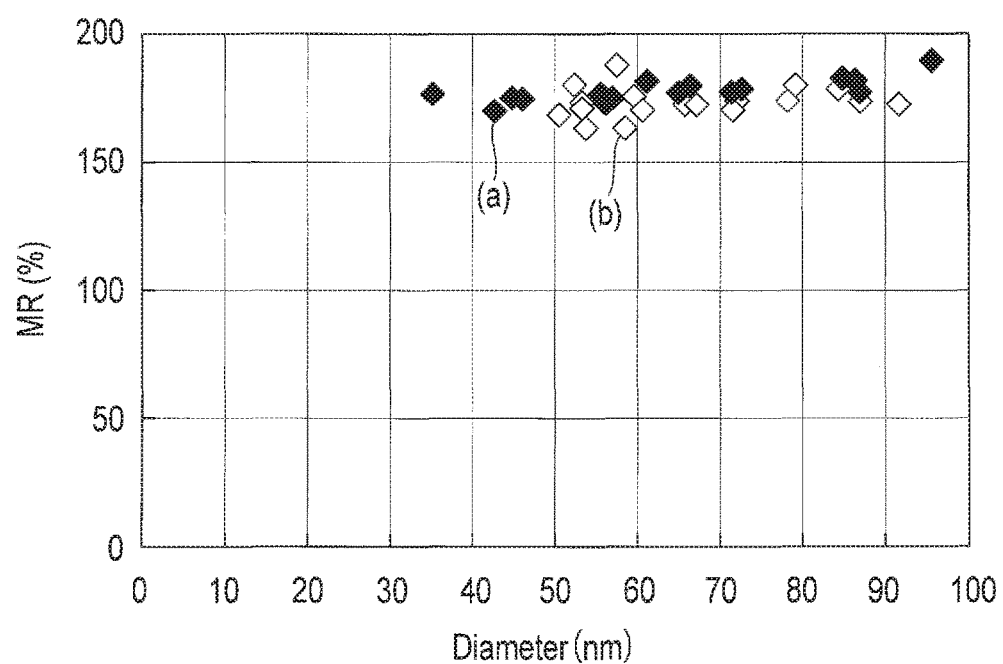
FIG. 5 shows performance evaluation results of the magnetoresistive effect element of the embodiment and the magnetoresistive effect element of the comparative example.

FIGS. 4 and 5 show performance evaluation results (measurement results) of the magnetoresistive effect element of the present embodiment and a magnetoresistive effect element of a comparative example. Groups (a) of FIGS. 4 and 5 are performance evaluation results of the magnetoresistive effect element of the present embodiment, and groups (b) of FIGS. 4 and 5 are performance evaluation results of the magnetoresistive effect element of the comparative example. In FIG. 4, the horizontal axis represents the diameter of the magnetoresistive effect element and the vertical axis represents the shift field Hshift. In FIG. 5, the horizontal axis represents the diameter of the magnetoresistive effect element and the vertical axis represents the MR ratio.

In the reference layer of the magnetoresistive effect element of the present embodiment, a CoFeB layer, CoFeB—Si layer, CoFeB layer, Ta layer, CoFeB layer, and TbCoFe layer are stacked in this order from the bottom side to the top side. That is, as shown in FIG. 3, a CoFeB—Si layer (third layer 23, a CoFeB layer with Si contained therein) is interposed between one CoFeB layer (first layer 21) and the other CoFeB layer (second layer 22). In a reference layer of the magnetoresistive effect element of the comparative example, a CoFeB layer, Ta layer, CoFeB layer, and TbCoFe layer are stacked in this order from the bottom side to the top side.

As shown in FIG. 4, the shift field Hshift is reduced better in the magnetoresistive effect element of the present embodiment as compared to the magnetoresistive effect element of the comparative example. That is, the reference layer of the magnetoresistive effect element of the present embodiment exhibits lower Mst as compared to the reference layer of the magnetoresistive effect element of the comparative example. Furthermore, as shown in FIG. 5, the present embodiment and the comparative example indicate substantially the same MR ratio. Evidently, both the low Mst and the high MR ratio can be achieved when the structure of the present embodiment is adopted.

Figure 6:
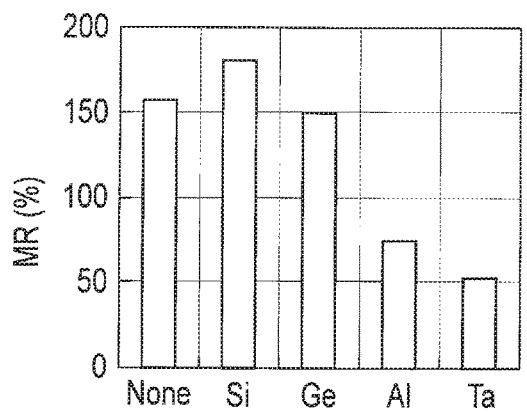
FIG. 6 shows evaluation results (measurement results) of the MR ratio with respect to each element contained in a tunnel barrier layer of the magnetoresistive effect element.

FIG. 6 shows evaluation results (measurement results) of the MR ratio with respect to each element contained in the tunnel barrier layer of the magnetoresistive effect element. Specifically, an element X inserted into the interface between the CoFeB layer of the reference layer and the MgO layer of the tunnel barrier layer is changed in five ways and the MR ratio in each case was evaluated (measured). The thickness of the element X layer is 0.2 nm which is extremely thin. Therefore, the element X is absorbed into the tunnel barrier layer by heat treatment, and partly composes the tunnel barrier layer. Note that "none" column in FIG. 6 represents a case where an element X is not inserted.

As can be understood from FIG. 6, the MR ratio becomes larger than it does in the case where an element X is not inserted only when silicon (Si) is inserted. Therefore, silicon (Si) can improve the MR ratio of the magnetoresistive effect element when being inserted in the interface between the CoFeB layer of the reference layer and the MgO layer of the tunnel barrier layer. Here, silicon (Si) is absorbed into the tunnel barrier layer by heat treatment and partly composes the tunnel barrier layer as shown in FIG. 3. Consequently, the tunnel barrier layer containing magnesium (Mg), silicon (Si), and oxygen (O) can be achieved as stated above.

Figure 7:
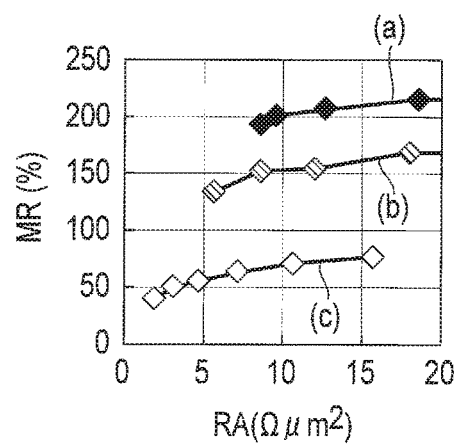
FIG. 7 shows evaluation results of the MR ratio measured when a lower part of a reference layer is structurally changed.

FIG. 7 shows evaluation results (measurement results) of the MR ratio measured when the lower part of the reference layer (interface part) is changed in several ways. In FIG. 7, the horizontal axis represents the resistance-area product and the vertical axis represents the MR ratio.

Plot (a) of FIG. 7 shows an evaluation result measured when the lower part of the reference layer is a stack structure including a CoFeB layer, CoFeB—Si layer, and CoFeB layer. That is, the MR ratio is measured where a CoFeB—Si layer (third layer 23, a CoFeB layer with Si contained therein) is interposed between one CoFeB layer (first layer 21) and the other CoFeB layer (second layer 22) as shown in FIG. 3. Plot (b) of FIG. 7 shows an evaluation result measured when the lower part of the reference layer is a stack structure including a CoFeB layer, Si layer, and CoFeB layer. That is, the MR ratio is measured where an Si layer (third layer 23) is interposed between one CoFeB layer (first layer 21) and the other CoFeB layer (second layer 22). Plot (c) of FIG. 7 shows an evaluation result measured when the lower part of the reference layer is a CoFeB layer alone.

As can be understood from FIG. 7, the MR ratio increases when the CoFeB—Si layer or the Si layer is inserted between CoFeB layers. Especially, the MR ratio increases greatly when the CoFeB—Si layer is inserted between the CoFeB layers.

As above, the MR ratio of the magnetoresistive effect element can be improved when the third layer 23 containing a semiconductor such as Si is between the first layer 21 containing iron (Fe) and boron (B) and the second layer 22 containing iron (Fe) and boron (B). This will be caused by the following mechanism. Firstly, the third layer 23 containing a semiconductor such as Si extends a gap between a TbCoFe layer in the fourth layer 24 of the reference layer 20 and the tunnel barrier layer 30, and an element diffusion during a heat treatment for crystallization can be suppressed. Therefore, degradation of the MR ratio caused by the element diffusion can be suppressed, too. Secondly, Si or the like used for the semiconductor has a higher electric resistance than a material such as CoFeB or the like and does not easily pass electrons therethrough. Therefore, degradation of the polarizability can be suppressed and the MR ratio can be increased.

Figure 8:
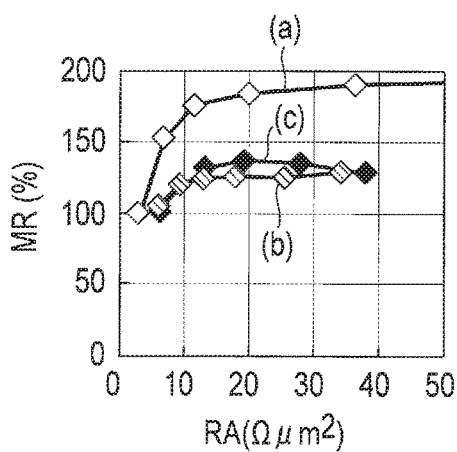
FIG. 8 shows evaluation results of the MR ratio measured when the lower part of the reference layer is structurally changed.

FIG. 8 shows different evaluation results (measurement results) of the MR ratio measured when the lower part of the reference layer is changed in several ways.

Plot (a) of FIG. 8 shows an evaluation result measured when the lower part of the reference layer is a stack structure including an FeB layer, Ge layer, and FeB layer. That is, the MR ratio is measured where a Ge layer (third layer 23) is interposed between one FeB layer (first layer 21) and the other FeB layer (second layer 22) as shown in FIG. 3. Plot (b) of FIG. 8 shows an evaluation result measured when the lower part of the reference layer is an FeB layer containing Ge. Plot (c) of FIG. 8 shows an evaluation result measured when the lower part of the reference layer is an FeB layer alone.

As shown in FIG. 8, the MR ratio further increases when a semiconductor layer such as Ge is inserted between the FeB layers as compared to a case where a semiconductor such as Ge is contained in the FeB layers. If the semiconductor such as Ge is contained in the layers of a magnetic substance such as FeB, a temperature for crystallization of the magnetic substance layers is increased, and this is not suitable. Therefore, as shown in FIG. 3, the third layer 23 containing a semiconductor should be interposed between the first layer 21 and the second layer 22.

Figure 9:
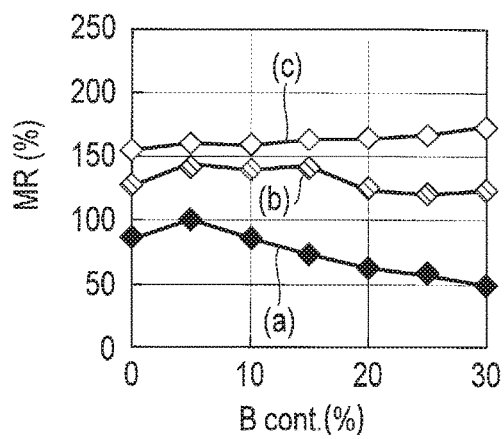
FIG. 9 shows relationships between the concentration of boron in a CoFeB layer and the MR ratio measured with different heat treatment temperatures.

The lower part of the reference layer 20 of FIG. 3 is formed of a CoFeB layer (first layer) 21, CoFeB layer (second layer) 22, and Ge layer (third layer) 23 with different heat treatment temperatures. FIG. 9 shows a relationship between the concentration of boron (B) in the CoFeB layers 21 and 22 and the MR ratio in each temperature. Plot (a) of FIG. 9 shows an evaluation result where the heat treatment temperature is 400° C., plot (b) of FIG. 9 shows an evaluation result where the heat treatment temperature is 450° C., and plot (c) of FIG. 9 shows an evaluation result where the heat treatment temperature is 500° C. As shown in FIG. 9, even if the concentration of B is increased (to 30 atom % or more, for example) to achieve low Mst, high MR ratio can be maintained by raising the heat treatment temperature.

Furthermore, suppression of spin scattering is important to achieve the high MR ratio. For the suppression of spin scattering, the tunnel barrier layer 30 and the lower part of the reference layer 20 should be crystallized. Here, since the heat treatment is performed while the Si layer is inserted between the MgO layer of the tunnel barrier layer and the CoFeB layer of the reference layer, Si is absorbed into the tunnel barrier layer, and the crystallized tunnel barrier layer containing magnesium (Mg), silicon (Si), and oxygen (O) can be achieved. For example, evaluation results obtained through TEM and EELS have confirmed that the crystallization structure can be obtained by heat treatment at 450° C. In addition to the spin filter function of the tunnel barrier layer containing magnesium (Mg), silicon (Si), and oxygen (O), the crystallization of the tunnel barrier layer is another factor of the high MR ratio.

Furthermore, the thickness of each layer in the lower part of the reference layer should be optimized to achieve the high MR ratio.

FIGS. 10 to 13 mainly show evaluation results (measurement results) of the MR ratio measured when the thickness of each layer in the lower part of the reference layer is changed. The lower part of the reference layer is prepared by forming an Si layer, CoFeB layer, CoFeB—Si layer, and CoFeB layer successively on an MgO layer used as the tunnel barrier layer and then applying a heat treatment thereto. By the heat treatment, Si in the Si layer is absorbed into the MgO layer and the tunnel barrier layer containing Mg, Si, and O can be achieved. The thicknesses of each layer in the figures are measured before the heat treatment.

Figure 10:
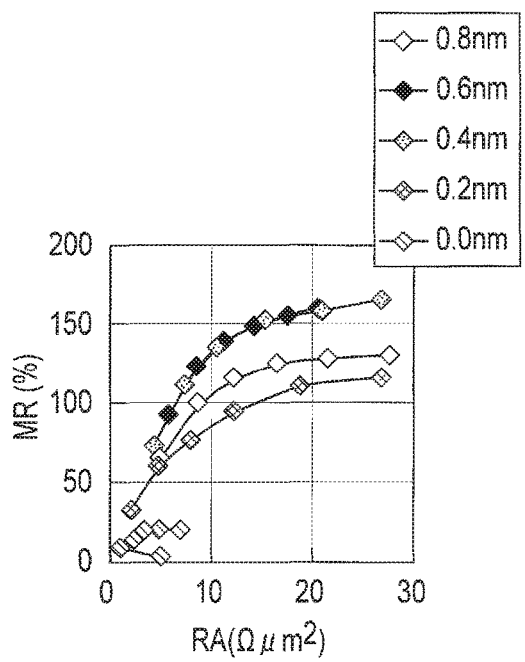
FIG. 10 shows evaluation results of the MR ratio measured by varying the thickness of a layer used in the lower part of the reference layer.
Figure 11:
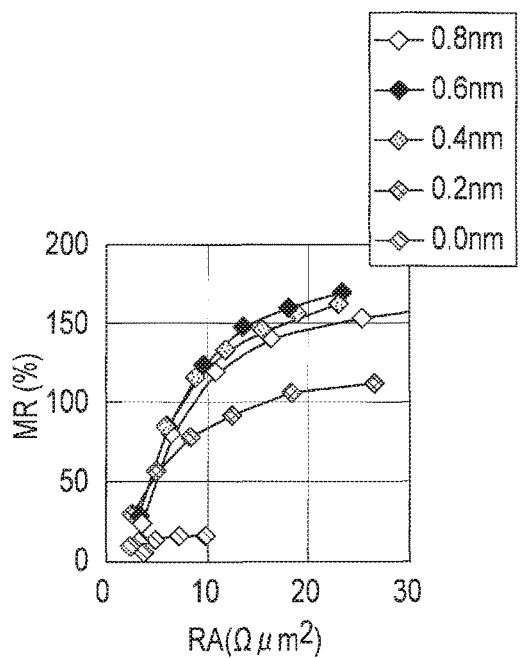
FIG. 11 shows evaluation results of the MR ratio measured by varying the thickness of another layer used in the lower part of the reference layer.
Figure 12:
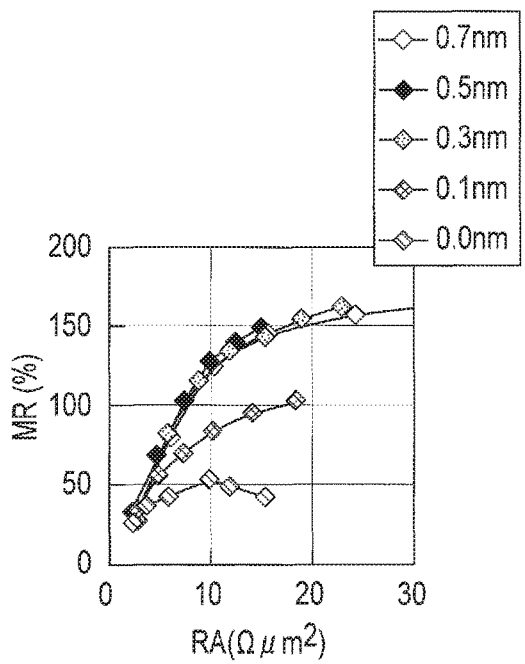
FIG. 12 shows evaluation results of the MR ratio measured by varying the thickness of another layer used in the lower part of the reference layer.
Figure 13:
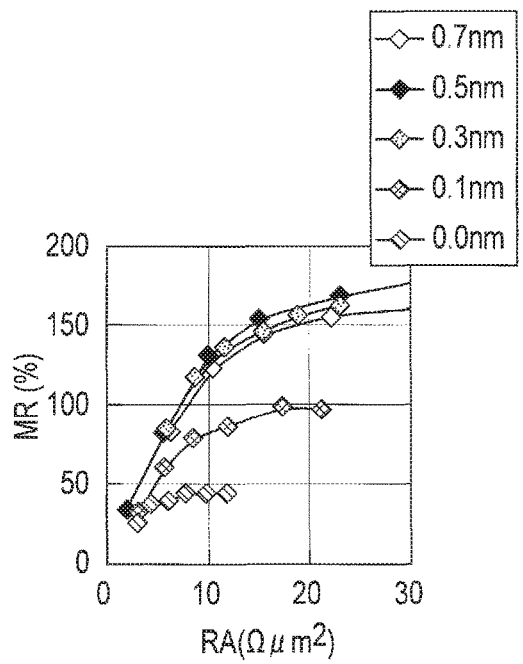
FIG. 13 shows evaluation results of the MR ratio measured by varying the thickness of another layer used in the lower part of the reference layer.

FIG. 10 shows MR ratios measured where the thickness of the Si layer is changed. FIG. 11 shows MR ratios measured where the thickness of the CoFeB layer (at the bottom side) is changed. FIG. 12 shows MR ratios measured where the thickness of the CoFeB—Si layer is changed. FIG. 13 shows MR ratios measured where the thickness of the CoFeB layer (at the top side) is changed. The thicknesses of the layers other than the layer targeted for the thickness change are all fixed. Standard thickness of each layer (a fixed value when the thickness is unchanged) is 0.4 nm for the Si layer, 0.4 nm for the CoFeB layer (bottom side), 0.3 nm for the CoFeB—Si layer, and 0.3 nm for the CoFeB layer (top side).

As can be understood from FIGS. 10 to 13, the MR ratio becomes high when the thickness of each layer is approximately 0.3 to 0.6 nm. Therefore, the thickness of each layer should be set 0.3 to 0.6 nm to achieve the high MR ratio.

Furthermore, the tunnel barrier layer (containing Mg, Si, and O) should include an oxygen deficiency structure to achieve the high MR ratio.

The tunnel barrier layer with the oxygen deficiency structure can be formed as follows. Firstly, an MgO layer (of thickness 1 nm) is prepared through RF magnetron sputtering. Then, an Si layer (of thickness 0.4 nm), or an Si layer (of thickness 0.2 nm), Mg layer (of thickness 0.2 nm), and Si layer (of thickness 0.2 nm) are formed on the MgO layer successively through DC sputtering. Then, a heat treatment is performed at a temperature of 400° C. or higher. Thereby, the tunnel barrier layer containing Mg, Si, and O with the oxygen deficiency structure can be achieved.

By using the tunnel barrier layer with the oxygen deficiency structure prepared as above, oxidization of the reference layer can be suppressed and the crystallized tunnel barrier layer with the high MR ratio can be achieved.

Note that, if the thickness of the Mg layer increases, the crystallization is weakened and the MR ratio is reduced. Therefore, in the tunnel barrier layer containing Mg, Si, and O, the thickness of each of the Si layer and the Mg layer on the MgO layer should be 0.6 nm or less.

Furthermore, the content of magnesium oxide (MgO) should be higher on the storage layer side than on the reference layer side, and the content of silicon oxide (SiO) should be higher on the reference layer side than on the storage layer side. By increasing the content of magnesium oxide on the storage layer side, perpendicular magnetic anisotropy of the storage layer can be improved. Furthermore, by increasing the content of silicon oxide on the reference layer side, electron transmittance in the tunnel barrier layer is improved, and the low Mst and high MR ratio can be achieved.

Figure 14:
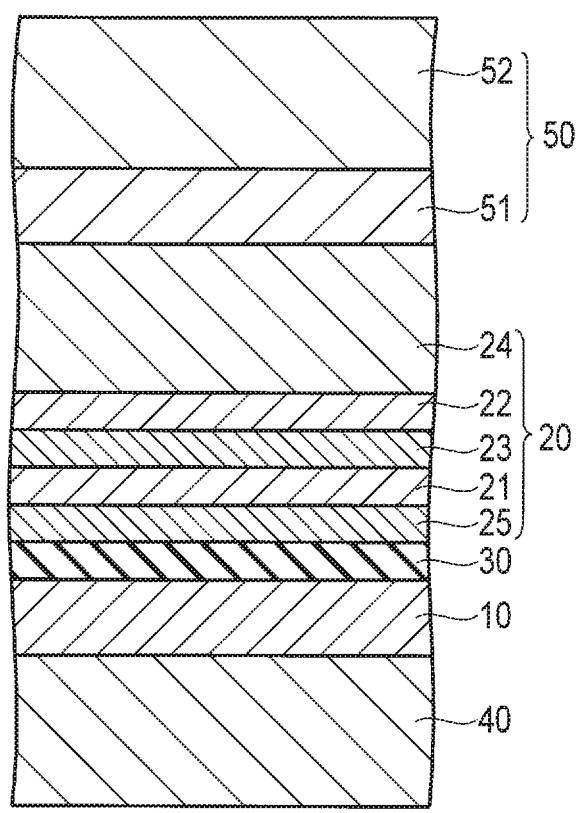
FIG. 14 is a cross-sectional view which schematically shows a stack structure of a magnetoresistive effect element of a variation of the embodiment.

FIG. 14 is a cross-sectional view which schematically shows a stack structure of a magnetoresistive effect element of a variation of the embodiment.

In this variation, the reference layer 20 further includes a fifth layer 25 containing a semiconductor. Specifically, a CoFeBSi layer as the fifth layer 25 is disposed between a tunnel barrier layer 30 and a first layer 21 of a reference layer 20. That is, the reference layer 20 includes TbCoFe (12 nm)/CoFeB (0.6 nm)/Ta (0.2 nm)/CoFeB (0.3 nm)/CoFeBSi (0.3 nm)/CoFeB (0.4 nm)/CoFeBSi (0.2 nm). Furthermore, the tunnel barrier layer 30 includes Si (0.2 nm)/Mg (0.2 nm)/MgO (1 nm).

Figure 15A:
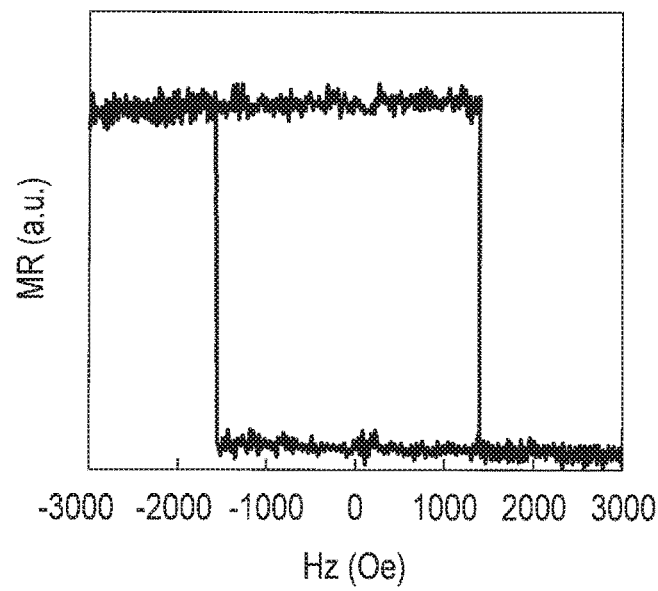
FIG. 15A shows evaluation results of a shift field of a magnetoresistive effect element of a variation of the embodiment.
Figure 15B:
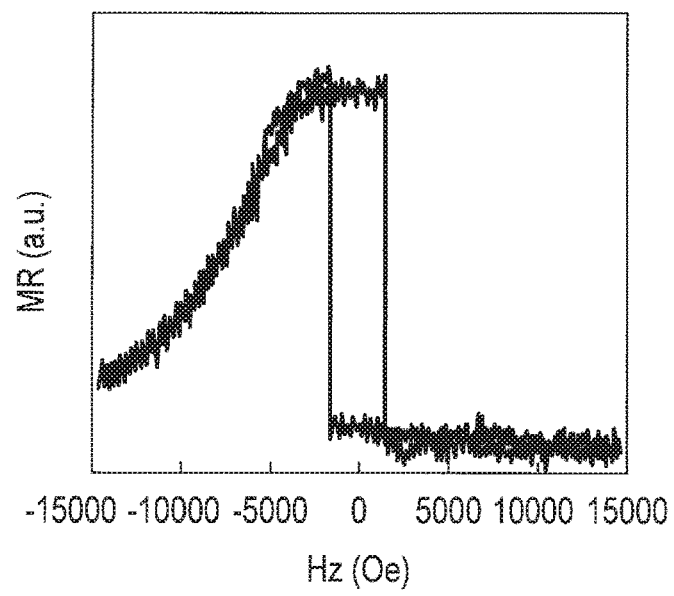
FIG. 15B shows further evaluation results of the shift field of the magnetoresistive effect element of the variation of the embodiment.

FIGS. 15A and 15B show evaluation results of a shift field of the magnetoresistive effect element of the variation. The element used in the evaluation has a diameter of approximately 40 nm. The part including TbCoFe (12 nm)/CoFeB (0.6 nm)/Ta (0.2 nm)/and the part including CoFeB (0.3 nm)/CoFeBSi (0.3 nm)/CoFeB (0.4 nm)/CoFeBSi (0.2 nm) are coupled in an antiparallel manner, and the Tb concentration is optimized to achieve zero shift field.

In the above described embodiments, expressions such as CoFeB (cobalt iron boron), FeB (iron boron), MgO (magnesium oxide), TbCoFe (terbium cobalt iron) do not always mean a composition ratio of each of these materials. For example, the expression of CoFeB means that the CoFeB material contains Co, Fe and B.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising a stack structure including a first magnetic layer having a variable magnetization direction, a second magnetic layer having a fixed magnetization direction, and a nonmagnetic layer provided between the first magnetic layer and the second magnetic layer,
   wherein the second magnetic layer includes a first layer containing iron (Fe) and boron (B), a second layer containing iron (Fe) and boron (B), and a third layer provided between the first layer and the second layer and containing a semiconductor in an entire region thereof, wherein the third layer is in physical contact with both the first layer and the second layer, and wherein the third layer has a semiconductor concentration higher than a semiconductor concentration of the first layer and a semiconductor concentration of the second layer.

2. The device of claim 1, wherein the semiconductor of the third layer includes at least one group-4 semiconductor element.

3. The device of claim 2, wherein the at least one group-4 semiconductor element includes at least one of silicon (Si) and germanium (Ge).

4. The device of claim 1, wherein the semiconductor of the third layer includes a compound semiconductor.

5. The device of claim 1, wherein the third layer further contains iron (Fe) and boron (B).

6. The device of claim 5, wherein the third layer further contains cobalt (Co).

7. The device of claim 1, wherein the first layer further contains cobalt (Co).

8. The device of claim 1, wherein the second layer further contains cobalt (Co).

9. The device of claim 1, wherein the first layer contacts the nonmagnetic layer.

10. The device of claim 1, wherein the second magnetic layer further includes a fourth layer containing a material which is different from a material of the first layer, a material of the second layer, and a material of the third layer, and
    wherein the first layer, the second layer, and the third layer are provided between the nonmagnetic layer and the fourth layer.

11. The device of claim 10, wherein the fourth layer includes a layer containing an element selected from Tb, Dy, and Gd, and an element selected from Co and Fe, and
    wherein magnetization of the first layer, the second layer, and the third layer and magnetization of the fourth layer are coupled in an antiparallel manner.

12. The device of claim 1, wherein the second magnetic layer further includes a fifth layer provided between the nonmagnetic layer and the first, second, and third layers, the fifth layer containing a semiconductor.

13. The device of claim 1, wherein the nonmagnetic layer contains magnesium (Mg), silicon (Si), and oxygen (O).

14. The device of claim 13, wherein concentration of magnesium (Mg) is higher on the first magnetic layer side than on the second magnetic layer side in the nonmagnetic layer.

15. The device of claim 13, wherein concentration of silicon (Si) is higher on the second magnetic layer side than on the first magnetic layer side in the nonmagnetic layer.

16. The device of claim 13, wherein the nonmagnetic layer includes a crystal structure.

17. The device of claim 13, wherein the nonmagnetic layer includes an oxygen deficiency structure.

18. The device of claim 1, wherein the first magnetic layer contains iron (Fe) and boron (B).

19. The device of claim 18, wherein the first magnetic layer further contains cobalt (Co).

20. The device of claim 1, wherein the first magnetic layer has a magnetization direction perpendicular to a main surface thereof, and
    wherein the second magnetic layer has a magnetization direction perpendicular to a main surface thereof.

* * * * *